(12) United States Patent
Yamauchi et al.

(10) Patent No.: US 6,606,276 B2
(45) Date of Patent: Aug. 12, 2003

(54) SRAM DEVICE USING MIS TRANSISTORS

(75) Inventors: Hiroyuki Yamauchi, Osaka (JP); Kazuo Itoh, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 10/040,634

(22) Filed: Jan. 9, 2002

(65) Prior Publication Data

US 2002/0100920 A1 Aug. 1, 2002

(30) Foreign Application Priority Data

Jan. 26, 2001 (JP) .................................... 2001-018595

(51) Int. Cl.⁷ .............................................. G11C 8/00
(52) U.S. Cl. .................................. 365/230.05; 365/51
(58) Field of Search ................................. 257/200, 390, 257/301, 921, 277; 365/154, 156, 230.05, 51, 63, 189.01, 189.04; 327/566, 564, 565

(56) References Cited

U.S. PATENT DOCUMENTS

| 5,744,844 A | 4/1998 | Higuchi |
| 5,754,467 A * | 5/1998 | Ikeda et al. ................. 365/154 |
| 5,777,920 A * | 7/1998 | Ishigaki et al. ............. 365/154 |
| 5,930,163 A | 7/1999 | Hara et al. |
| 6,211,004 B1 * | 4/2001 | Ikeda et al. ................. 438/238 |

FOREIGN PATENT DOCUMENTS

| JP | 9-270468 | 10/1997 |
| JP | 10-178110 | 6/1998 |
| JP | 09141437 A * | 12/1998 |

* cited by examiner

*Primary Examiner*—Wael Fahmy
*Assistant Examiner*—Dana Farahani
(74) *Attorney, Agent, or Firm*—McDermott, Will & Emery

(57) ABSTRACT

An SRAM device according to the present invention comprises a memory cell including a first pair of bit lines connected to a first port, a second pair of bit lines connected to a second port, a first inverter, and a second inverter having an input terminal connected to the output terminal of the first inverter and an output terminal connected to the input terminal of the first inverter. The memory cell has a first region in which an impurity of a first conductivity type is diffused and second and third regions each of a second conductivity type which are adjacent to the first region and opposed to each other with the first region interposed therebetween. The first pair of bit lines are disposed on the second region and the second pair of bit lines are disposed on the third region.

12 Claims, 9 Drawing Sheets

Bit Line Pairs
(Pair of BLa, /BLa and Pair of BLb, /BLb)
Power Supply Line Vcc
Ground Lines Vss
Load Transistors (MP0, MP1)

Load Transistors (MP0, MP1)

Drive Transistors (MN0, MN1)
Access Transistors (MN2, MN4 and MN3, MN5)
Word Lines (WLa and WLb)

SRAM DEVICE USING MIS TRANSISTORS

BACKGROUND OF THE INVENTION

The present invention relates to SRAM devices and, more particularly, to a 2-port SRAM device (dual-port SRAM device).

Each of Japanese Laid-Open Patent Publications Nos. 10-178110 and 9-270468 discloses the layout of a memory cell composed of six transistors in an SRAM device. In particular, each of the foregoing publications discloses a method for reducing the aspect ratio (which is the ratio of the width of the memory cell in the direction in which a word line extends to the width thereof in the direction in which a bit line extends in the present specification) of the memory cell composed of six transistors shown in FIG. 7A, i.e., a method for laying out the cell such that the width thereof in the direction in which the word line extends is larger than the width thereof in the direction in which the bit line extends. Specifically, each of the publications discloses the layout in which P-wells 102a and 102b are placed on both sides of an N-well 101 to have the N-well 101 interposed therebetween, as shown in FIG. 7B. In the layout, the six transistors (MN0, MN1, MN2, MN3, MP0, and MP1) are arranged in generally symmetrical relation relative to the center point of the memory cell.

In the layout of a memory cell 100 shown in FIG. 7A and FIG. 7B, bit lines BL and /BL are disposed on the P-wells 102a and 102b, respectively. The drive transistors MN0 and MN1 each formed of an NMOS are laid out in generally symmetrical relation relative to the center point of the memory cell, as described above, and disposed on the P-wells 102a and 102b, respectively. Likewise, the access transistors MN2 and MN3 each formed of an NMOS are also laid out in generally symmetrical relation relative to the center point $P_{100}$ of the memory cell and disposed on the P-wells 102a and 102b, respectively. The load transistors MP0 and MP1 each composed of a PMOS are also laid out in generally symmetrical relation relative to the center point $P_{100}$ of the memory cell and disposed on the N-well 101. The load transistors MP0 and MP1 are arranged in two rows parallel to each other and in a direction in which the bit lines extend so that a PMOS region corresponding thereto has a large width (width of the N-well 101).

A description will be given herein below to the case of laying out a memory cell in a 2-port 8-transistor SRAM device shown in FIG. 8A by using the method disclosed in the foregoing publications. FIG. 8B shows a memory cell 200 in the 2-port 8-transistor SRAM device that has been laid out by using the technology disclosed in the foregoing publications. FIG. 9 diagrammatically shows a structure of the bit lines and word lines of the memory cell 200 shown in FIG. 8B. As indicated by the broken lines, the region shown in FIG. 8B and FIG. 9 corresponds to two memory cells (2 bits). The region defined by the broken lines in FIG. 9 is a memory cell region 200' corresponding to the memory cell 200 shown in FIG. 8B.

As shown in FIG. 8B and FIG. 9, the prior art technology positions P-wells 202a and 202b on both sides of an N-well 201 such that the N-well 201 is interposed therebetween. For the sake of convenience, two ports will be hereinafter referred to as ports A and B. A pair of bit lines (BLa, /BLa) for the port A are disposed on the P-wells 202a and 202b, respectively. A pair of bit lines (BLb, /BLb) for the port B are also disposed on the P-wells 202a and 202b, respectively. Consequently, the eight transistors are arranged in generally symmetrical relation relative to the center point $P_{200}$ of the memory cell 200.

The pair of access transistors (MN4, MN5) for the port A are disposed on the P-wells 202a and 202b, respectively. The pair of access transistors (MN2, MN3) for the port B are also disposed on the P-wells 202a and 202b, respectively. The load transistors (MP0, MP1) each formed of a PMOS are arranged in two rows, similarly to the foregoing memory cell 100, to be laid out in generally symmetrical relation relative to the center point $P_{200}$ of the memory cell 200 and disposed on the N-well 201. The load transistors MP0 and MP1 are arranged in two rows parallel to each other and in the direction in which the bit lines extend such that a PMOS region has a large width (width of the N-well 201).

The ports A and B are normally required to operate completely asynchronously. In the layout of the memory cell 200 shown in FIG. 8B, the bit lines BLa and BLb are disposed adjacent to the P-well 202a and the bit lines /BLa and /BLb are disposed adjacent to the P-well 202b. If the bit lines (BLa, /BLa) for the port A have a read potential difference of several tens of millivolts held therebetween and respective potentials on the bit lines (BLb, /BLb) for the port B vary dynamically to have a write potential difference of 1000 mV or more therebetween, wire-to-wire coupling occurs between the bit lines BLa and BLb disposed adjacent to each other and between the bit lines /BLa and /BLb disposed adjacent to each other. This significantly changes the read potential difference of several tens of millivolts between the bit lines (BLa, /BLa) for the port A and may destroy stored data.

SUMMARY OF THE INVENTION

The present invention has been achieved to solve the foregoing problem and it is therefore an object of the present invention to provide a highly reliable SRAM device.

An SRAM device according to the present invention comprises a memory cell, the memory cell including: a first pair of bit lines connected to a first port; a second pair of bit lines connected to a second port: a first inverter; and a second inverter having an input terminal connected to an output terminal of the first inverter and an output terminal connected to an input terminal of the first inverter, the memory cell having a first region in which an impurity of a first conductivity type is diffused and second and third regions each of a second conductivity type, the second and third regions being adjacent to the first region and opposed to each other with the first region interposed therebetween, the first pair of bit lines being disposed on the second region and the second pair of bit lines being disposed on the third region.

According to the present invention, even if the first and second ports operate completely asynchronously, the influence of wire-to-wire coupling is suppressed or prevented since the first and second ports are disposed physically at a distance from each other.

The first inverter may be composed of first and second MIS transistors, the second inverter may be composed of third and fourth MIS transistors, the memory cell may further comprise: a fifth MIS transistor provided between the output terminal of the first inverter and one of the first pair of bit lines; a sixth MIS transistor provided between the output terminal of the first inverter and one of the second pair of bit lines; a seventh MIS transistor provided between the output terminal of the second inverter and the other of the first pair of bit lines; and an eighth MIS transistor provided between the output terminal of the second inverter and the other of the second pair of bit lines, and the first, second, third, fourth, fifth, sixth, seventh, and eighth MIS transistors may have respective channels oriented in approximately the same direction.

Preferably, the second and fourth MIS transistors are formed on the first region, the first, fifth, and seventh MIS transistors are formed on the second region, the third, sixth, and eighth MIS transistors are formed on the third region, the first and third MIS transistors are disposed in generally symmetrical relation relative to a center point of the memory cell; the fifth and sixth MIS transistor are disposed in generally symmetrical relation relative to the center point of the memory cell, the seventh and eighth MIS transistor are disposed in generally symmetrical relation relative to the center point of the memory cell, and the second and fourth MIS transistor are disposed in generally symmetrical relation relative to the center point of the memory cell.

In the arrangement, the memory cell has a highly symmetrical structure. This achieves the prominent effects of providing an electrical characteristic with a higher degree of symmetry than has been provided conventionally and providing an SRAM device operating with higher stability. Since the memory cell has a highly symmetrical structure, even if slight misalignment occurs in a lithographic step of the fabrication process or the like, the misalignment itself has symmetry. This suppresses a problem associated with the electric characteristic resulting from the misalignment and improves the production yield of the SRAM device.

The SRAM device further comprises: a first gate wire providing connections among a gate of the fifth MIS transistor, a gate of the seventh MIS transistor, and the first port; and a second gate wire providing connections among a gate of the sixth MIS transistor, a gate of the eighth MIS transistor, and the second port wherein the first and second gate wires are disposed in generally symmetrical relation relative to the center point of the memory cell.

In accordance with the present invention, each of the fifth and seventh MIS transistors connected to the first port is placed on the second region. On the other hand, each of the sixth and eighth MIS transistors connected to the second port is placed on the third region. Consequently, the first and second gate wires connected to the first and second ports, respectively, are connected to the respective gate electrodes of the MIS transistors and do not intersect each other. This allows the first and second gate wires to be disposed in generally symmetrical relation relative to the center point of the memory cell and thereby reduces the degree of asymmetry of the electric characteristic of the memory cell.

Preferably, the second and fourth MIS transistors have respective channels oriented in parallel to a direction in which the first pair of bit lines extend and disposed on a straight line passing through the center point of the memory cell.

The arrangement allows a reduction in the width of the first region and provides a memory cell with a high degree of integration.

The first conductivity type may be an n-type and the second conductivity type may be a p-type.

Preferably, the SRAM device further comprises: a first active region provided with the first MIS transistor and either one of the fifth and seventh MIS transistors and indiscrete in the direction in which the bit lines extend; and a second active region provided with the third MIS transistor and either one of the sixth and eighth MIS transistors and indiscrete in the direction in which the bit lines extend.

In the arrangement, the first MIS transistor and either one of the fifth and seventh MIS transistors, each provided on the first active region, and the third MIS transistor and either one of the sixth and eighth MIS transistors, each provided on the second active region, are disposed in generally symmetrical relation relative to the center point of the memory cell. Since the first and second active regions are disposed in generally symmetrical relation relative to the center point of the memory cell, an electrically symmetrical characteristic is achievable. Since each of the first and second active regions is indiscrete in the direction in which the bit lines extend, contacts for providing a connection between contact nodes are no more necessary.

Preferably, the first active region has a first expanded portion, the second active region has a second expanded portion, the first MIS transistor is formed on the first expanded portion, and the third MIS transistor is formed on the second expanded portion.

In the arrangement, the first and second expanded portions are formed in generally symmetrical relation relative to the center point of the memory cell. Accordingly, an electrically symmetrical characteristic is achievable, while a high degree of integration is retained.

The first and second expanded portions may be formed on the respective parts of the first and second active regions each opposed to the first region.

The first and second expanded portions may be formed on the respective parts of the first and second active regions each opposite to the first region.

Preferably, dummy active regions for increasing respective parasitic capacitances of the first and second inverters are disposed between the first region and the first active region and between the first region and the second active region.

The arrangement increases the capacity of the data storage section of the memory cell and suppresses or prevents the destruction of data (soft error) caused by momentary dissipation of charge from the data storage section under the radiation of a radio-active ray.

Preferably, the SRAM device further comprises: a power supply line disposed between the first and second pairs of bit lines in parallel relation to the first and second pairs of bit lines; a first ground line disposed in opposing relation to the power supply line with the first pair of bit lines interposed between the first ground line and the power supply line; and a second ground line disposed in opposing relation to the power supply line with the second pair of bit lines interposed between the second ground line and the power supply line.

In the arrangement, the first pair of bit lines and the second pair of bit lines are interposed between the power supply line and the ground lines. As a result, the first pair of bit lines and the second pair of bit lines are shielded from potential variations and effects mutually exerted thereon are reduced. This positively suppresses or prevents wire-to-wire coupling.

DETAILED DESCRIPTION OF THE INVENTION

Figure 1A:
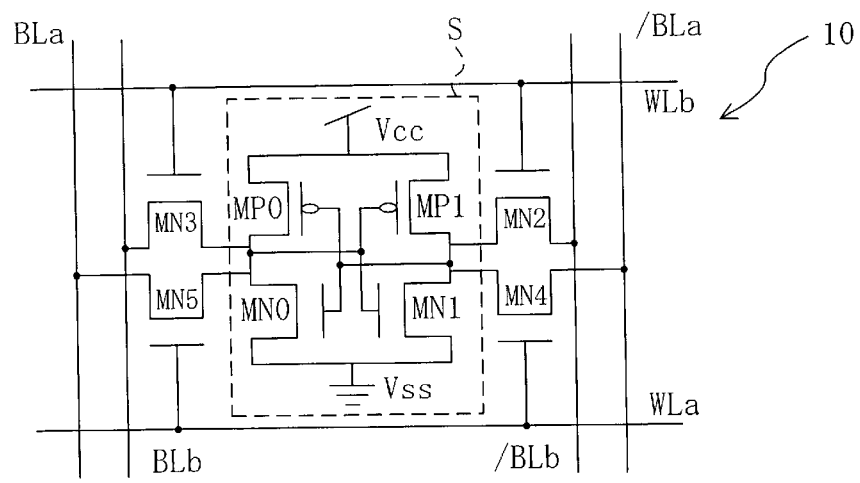
FIG. 1A is a circuit diagram of a memory cell provided in a 2-port 8-transistor SRAM device according to EMBODIMENT 1 and FIG. 1B is a diagrammatical top view of the layout of the memory cell according to EMBODIMENT 1.

Referring now to the drawings, the embodiments of the present invention will be described. For simplicity, components commonly used in the embodiments are designated at the same reference numerals.

EMBODIMENT 1

The present embodiment will be described with reference to FIG. 1A, FIG. 1B, FIG. 2, FIG. 3A, FIG. 3B, FIG. 3C, and FIG. 4.

Figure 1B:
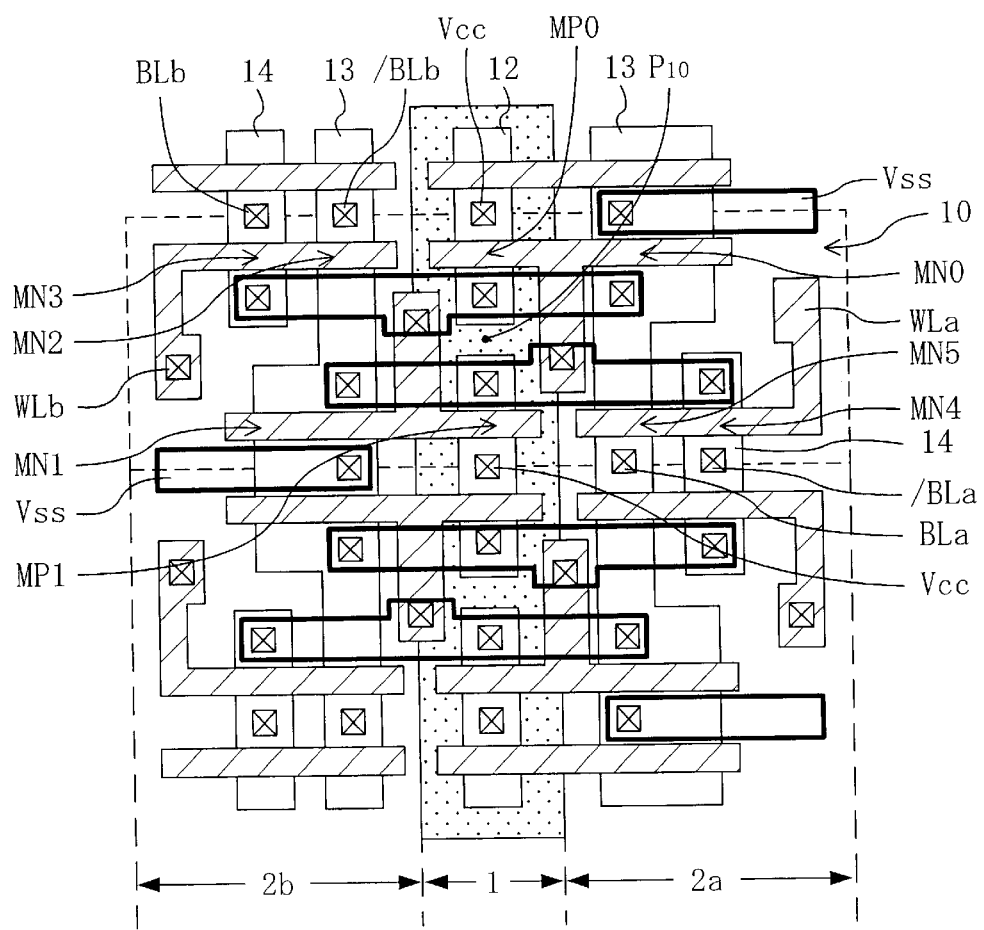
Figure 2:
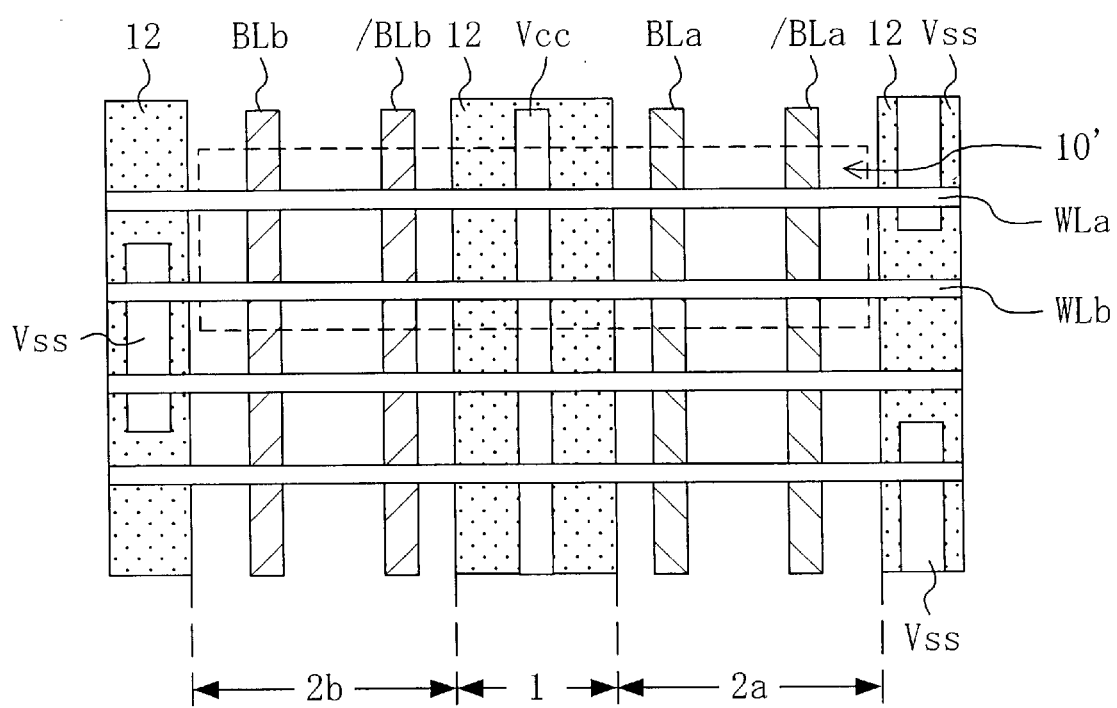
FIG. 2 shows a structure of the bit lines and word lines of the memory cell according to EMBODIMENT 1 shown in FIG. 1B.

FIG. 1A is a circuit diagram of a memory cell 10 provided in a 2-port 8-transistor SRAM device according to the present embodiment. FIG. 1B is a diagrammatical top view of the layout of the memory cell 10 according to the present embodiment. FIG. 2 shows a structure of the bit lines and word lines of the memory cell 10 according to the present embodiment shown in FIG. 1B. As indicated by the broken lines, the region shown in FIG. 1A, FIG. 1B, and FIG. 2 corresponds to two memory cells (2 bits). The region defined by the broken lines in FIG. 2 is a memory cell region 10' corresponding to the memory cell 10 shown in FIG. 1B.

The memory cell 10 according to the present embodiment comprises: a complementary data storage section S constructed by cross-coupling CMOS inverters composed of MOS transistors MP0, MP1, MN0, and MN1; a pair of bit lines (BLa, /BLa) and a word line (WLa) each for accessing a port A; a pair of bit lines (BLb, /BLb) and a word line (WLb) each for accessing a port B; a pair of access transistors (MN2, MN3) for the port A for providing connections between the data storage section S and the pair of bit lines for the port A; and a pair of access transistors (MN4, MN5) for the port B for providing connections between the data storage section S and the pair of bit lines for the port B.

Specifically, the memory cell 10 is formed on a semiconductor substrate (not shown) comprising an N-well 1 and P-wells 2a and 2b formed to have the N-well 1 interposed therebetween, as shown in FIG. 1B and FIG. 2. The semiconductor substrate has a PMOS region 12 which is an active region 12 formed in the N-well 1 and NMOS regions 13 and 14 which are active regions formed in the P-wells 2a and 2b, respectively.

Each of the NMOS regions 13 is an indiscrete active region with no separation in the direction in which the bit lines extend, while each of the NMOS regions 14 is an active region separated from the CMOS inverters. The NMOS region 13 is formed to have a narrower portion which is adjacent to the NMOS region 14 separated from the CMOS inverters and a wider expanded portion which is not adjacent to the NMOS region 14. In the memory cell 10 according to the present embodiment, in particular, the wider portion of the NMOS region 13 is provided to expand in the direction opposite to the N-well 1.

The memory cell 10 is composed of the total of eight MOS transistors which are disposed to have respective channels oriented in the same direction. The MOS transistors are arranged in generally symmetrical relation relative to the center point $P_{10}$ of the memory cell 10. As shown in the circuit diagram of FIG. 1A, the MOS transistors have respective sources and drains connected with wires. A gate electrode 18 is disposed at the gate of each of the MOS transistors.

The transistors MN0 and MN1 of the CMOS inverters composing the data storage section S are provided on the wider portions of the NMOS regions 13. Of the pairs of access transistors, the transistors MN3 and MN4 are formed on the NMOS regions 13 and the transistors MN2 and MN5 are formed on the NMOS regions 14, as shown in FIG. 1B.

The foregoing structure provides an electrically symmetrical characteristic, while retaining a high degree of integration. Since each of the NMOS regions 13 is indiscrete in the direction in which the bit lines extend, contacts for providing a connection between connection nodes are no more necessary. The wider portion of the NMOS region 13 which is formed to expand in the direction opposite to the N-well 1 as in the present embodiment is particularly preferred since it reduces the density of wiring contacts providing connections between the gate electrodes and the active regions in the vicinity of the N-well 1.

The two pairs of bit lines (BLa, /BLa) and (BLb, /BLb) for the ports A and B are disposed separately on a per bit-line-pair basis on the P-wells 2a and 2b which are arranged laterally on both sides of the N-well 1, as shown in FIG. 2.

A description will be given to the memory cell 10 according to the present embodiment in comparison with the prior art memory cell 200 by using FIG. 3A, FIG. 3B, and FIG. 3C.

Figure 3A:
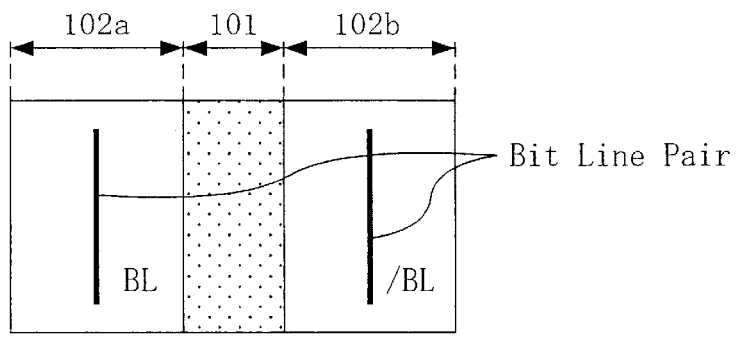
FIG. 3A, FIG. 3B, and FIG. 3C are schematic views showing the difference in structure between a bit line pair provided in a conventional memory cell and a bit line pair provided in the memory cell according to EMBODIMENT 1.
Figure 3B:
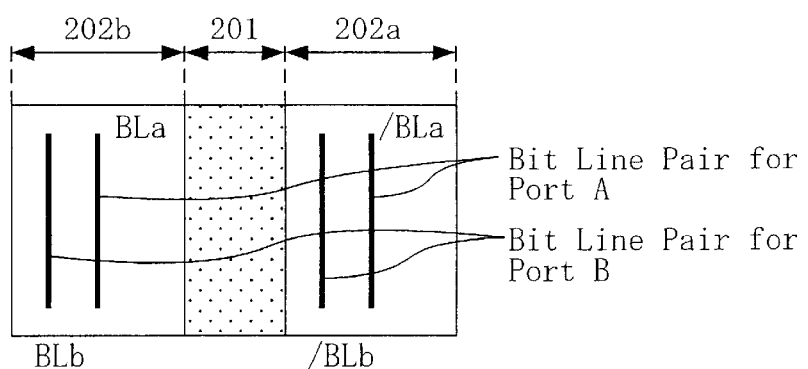
Figure 3C:
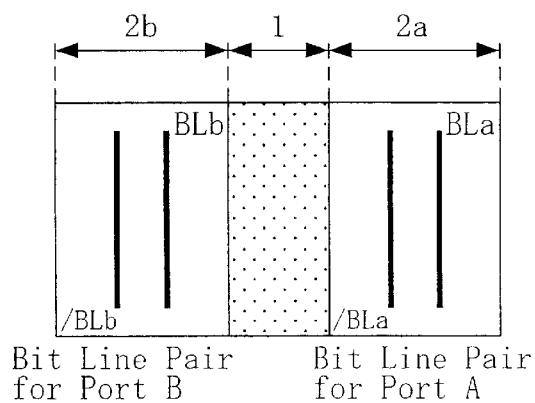

FIG. 3A shows the placement of the pair of bit lines (BL, /BL) of the memory cell disclosed in the foregoing publication. As shown in FIG. 3A, the bit lines BL and /BL complementary to each other are disposed on the P-wells 102a and 102b which are arranged laterally on both sides of the N-well 1. If the placement of the pair of bit lines is applied to a memory cell in a 2-port SRAM device, the pair of bit lines (/BLb, /BLa) are disposed on the right-hand P-well 202a, while the pair of bit lines (BLb, BLa) are disposed on the left-hand P-well 202b. In this case, if the ports A and B are operated completely asynchronously, stored data may be destroyed as described above.

In the present embodiment, by contrast, the pair of bit lines (BLa, /BLa) for the port A are disposed on the right-hand P-well 2a, while the pair of bit lines (BLb, /BLb) for the port B are disposed on the left-hand P-well 2b. Consequently, the pair of bit lines for the port A have a read potential difference of several tens of millivolts retained therebetween and, if the potentials at the pair of bit lines for the port B vary dynamically to have a write potential difference of 1000 mV or more therebetween, wire-to-wire coupling does not occur between the bit lines BLa and BLb or between the bit lines /BLa and /BLb. This suppresses or prevents the foregoing disadvantage.

By using FIGS. 4A, 4B, and 4C, a description will be given to the characteristics of the layout of the transistors, the power supply line Vcc, the ground line Vss, the word lines, and the bit lines composing the memory cell 10 in the 2-port 8-transistor SRAM device according to the present embodiment.

Figure 4A:
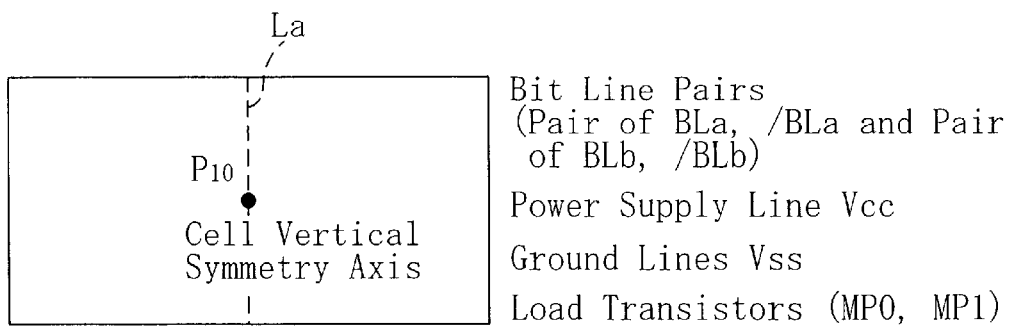
FIG. 4A, FIG. 4B, and FIG. 4C illustrate the characteristics of the layout of transistors, a power supply line Vcc, ground lines Vss, word lines, and bit lines composing the memory cell according to EMBODIMENT 1.

FIG. 4A shows symmetry relative to the symmetry axis parallel to the direction in which each of the bit lines extends. The pair of bit lines for the port A and the pair of bit lines for the port B are disposed in generally symmetrical relation relative to the symmetry axis $L_a$ passing through the center point $P_{10}$ of the memory cell 10 and parallel to each of the bit lines. The power supply line Vcc is disposed on the symmetry axis $L_a$. The ground lines Vss are disposed on the respective boundary lines between the memory cell 10 and the two memory cells laterally adjacent thereto in generally symmetrical relation relative to the symmetry axis $L_a$. The load transistors (MP0, MP1) of the PMOS are also disposed in generally symmetrical relation relative to the symmetry axis $L_a$.

Figure 4B:
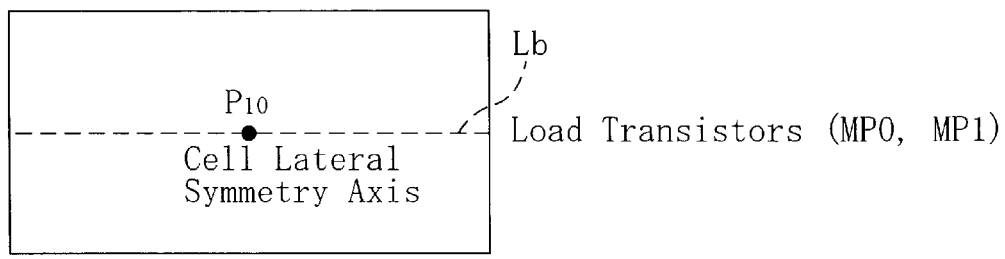

FIG. 4B shows symmetry relative to the symmetry axis parallel to the direction in which the word lines extend. The load transistors (MP0, MP1) of the PMOSs are disposed in generally symmetrical relation relative to the symmetry axis $L_b$ passing through the center point $P_{10}$ of the memory cell 10 and parallel to each of the bit lines.

Figure 4C:
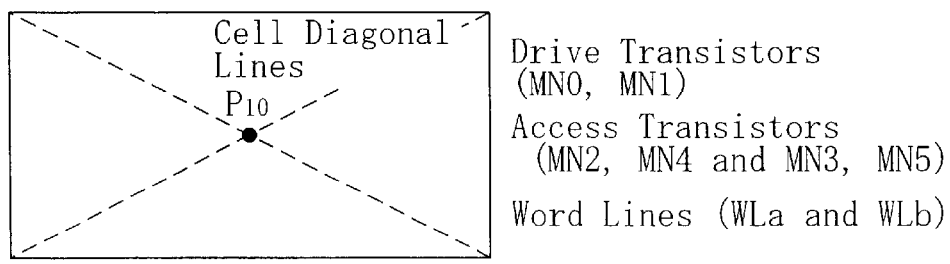

FIG. 4C shows symmetry relative to the center point $P_{10}$ of the memory cell. The pair of NMOS transistors (MN0, MN1) (normally termed the drive transistors of an SRAM device) of the CMOS inverter portion are disposed in generally symmetrical relation relative to the symmetry center $P_{10}$. Likewise, the two pairs of access transistors (MN2, MN3) and (MN4, MN5) are also disposed in generally symmetrical relation relative to the symmetry center $P_{10}$. The two pairs of word lines (WLa, WLb), the gate electrodes 18, and the contact portions 20 of metal wires are also disposed in generally symmetrical relation relative to the point.

Thus, the memory cell 10 has a highly symmetrical structure. This achieves the prominent effects of providing an electric characteristic with a higher degree of symmetry than has been provided conventionally and an SRAM device operating with higher stability. Since the memory cell 10 has a highly symmetrical structure, even if slight misalignment occurs in a lithographic step or the like of the fabrication process, the misalignment itself has symmetry. This suppresses a problem associated with the electric characteristic resulting from the misalignment and improves the production yield of the SRAM device.

According to the present embodiment, even if the ports A and B operate completely asynchronously to each other, the ports A and B are disposed physically at a distance from each other so that the influence of wire-to-wire coupling is reduced. In particular, the present embodiment achieves the prominent effect of more positively suppressing or preventing wire-to-wire coupling by providing the power supply line Vcc between ports A and B, as shown in FIG. 2.

The pair of access transistors (MN4, MN5) for the port A have conventionally been disposed on the P-wells 202a and 202b, respectively. On the other hand, the pair of access transistors (MN2, MN3) for the port B have conventionally been disposed on the P-wells 202a and 202b, respectively. This causes the necessity to connect the word line WLa for the port A and the word line WLb for the port B to the respective gate electrodes of the access transistors arranged in generally symmetrical relation relative to the center point $P_{200}$ of the memory cell. Accordingly, it is necessary to intersect the word lines WLa and WLb, while maintaining insulation therebetween. Specifically, the provision of connections between the access transistors MN4 and MN5 and between the access transistors MN2 and MN3 requires an extra wiring layer or the like, which complicates the wiring layout of the word lines WLa and WLb disadvantageously.

Since the pair of transistors of which electrical symmetry is required are positioned at a distance from each other in the memory cell, the problem of increased asymmetry of an electric characteristic in the memory cell, such as a non-uniform substrate potential, is encountered.

However, the present embodiment can solve the foregoing conventional problem because the pair of access transistors (MN4, MN5) for the port A have an indiscrete gate electrode as shown in FIG. 1B and are disposed in the internal regions of the same well located in close proximity to each other. The same shall apply to the pair of access transistors (MN2, MN3) for the port B.

In the conventional memory cell 200, the load transistors (MP0, MP1) each formed of the PMOS are arranged in two rows parallel to each other along the direction in which the bit lines extend such that they are generally symmetrical to each other relative to the center point $P_{200}$ of the memory cell. The arrangement increases the width of the PMOS region 12 (width of the N-well 1) disadvantageously.

According to the present embodiment, by contrast, the load transistors (MP0, MP1) formed of a pair of PMOSs placed in the PMOS region 12 are arranged in one row on a symmetry axis passing through the center point $P_{10}$ of the memory and parallel to the direction in which the bit lines extend. This achieves the prominent effect of a reduced width of the PMOS region 12 (width of the N-well 1), which has not been achieved conventionally.

EMBODIMENT 2

The present embodiment will be described with reference to FIG. 1A, FIG. 2, and FIG. 5.

Figure 5:
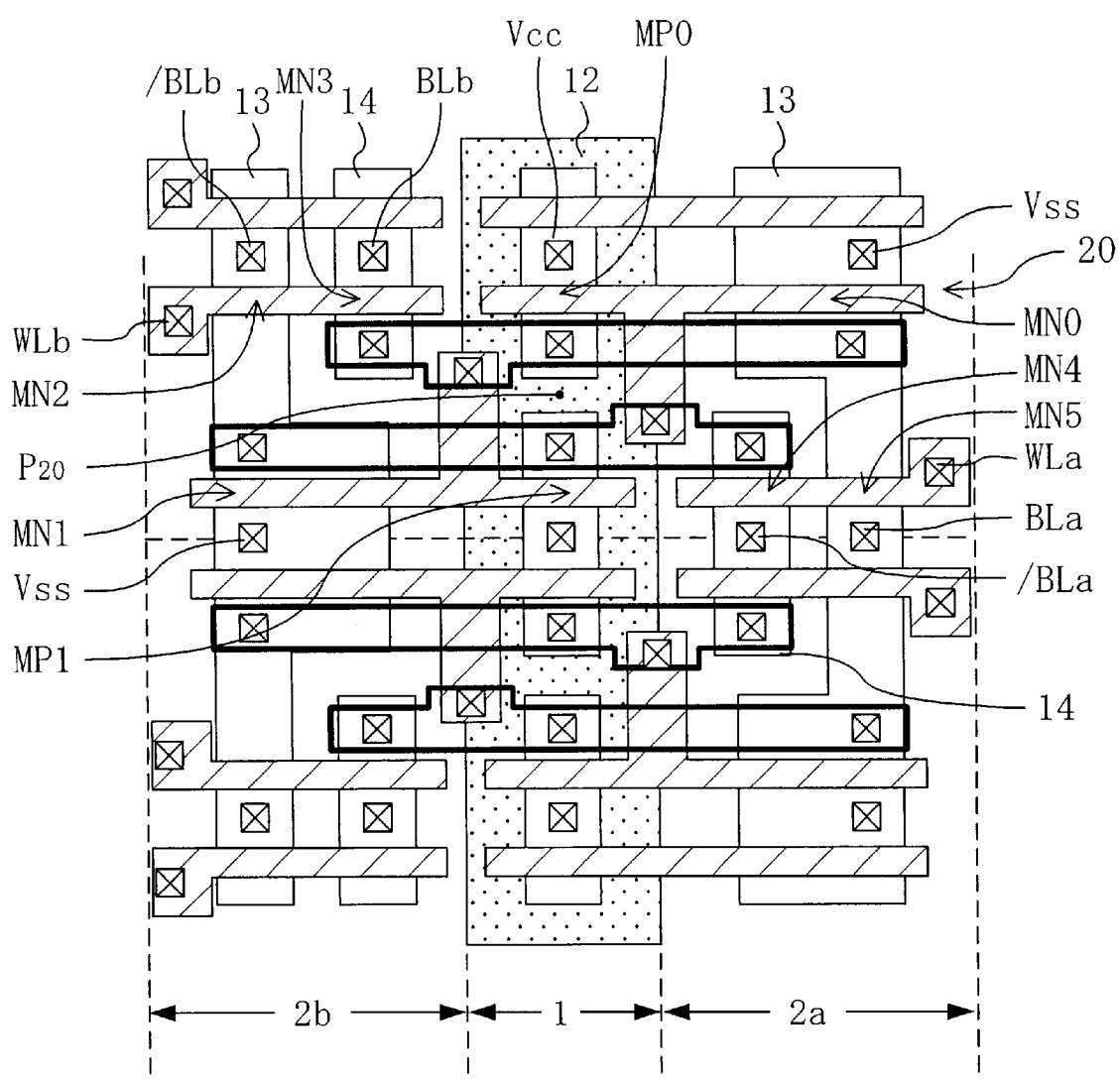
FIG. 5 is a diagrammatical top view of the layout of a memory cell according to EMBODIMENT 2.

FIG. 5 is a diagrammatical top view of the layout of a memory cell 20 according to the present embodiment. The memory cell 20 according to the present embodiment has the same circuit structure as the memory cell 10 according to EMBODIMENT 1, i.e., the circuit structure shown in FIG. 1A. The placement of the bit lines and the word lines is the same as in the memory cell 10 according to EMBODIMENT 1. The bit lines and the word lines have the structure shown in FIG. 2.

Specifically, as shown in FIG. 5, the memory cell 20 is formed on a semiconductor substrate (not shown) comprising an N-well 1 and P-wells 2a and 2b formed to have the N-well 1 interposed therebetween. The semiconductor substrate has a PMOS region 12 which is an active region formed in the N-well 1 and NMOS regions 13 and 14 which are active regions formed in the P-wells 2a and 2b, respectively.

Each of the NMOS regions 13 is an indiscrete active region with no separation in the direction in which the bit lines extend, while each of the NMOS regions 14 is an active region separated from CMOS inverters. The NMOS region 13 is formed to have a narrower portion which is adjacent to the NMOS region 14 separated from the CMOS inverters and a wider expanded portion which is not adjacent to the NMOS region 14. The memory cell 20 according to the present embodiment is particularly different from EMBODIMENT 1 in that the wider portion of the NMOS region 13 is provided to expand toward the N-well 1.

The memory cell 20 is composed of the total of eight MOS transistors which are disposed to have respective channels oriented in the same direction. The MOS transistors are arranged in generally symmetrical relation relative to the center point $P_{20}$ of the memory cell 10. As shown in the circuit diagram of FIG. 1A, the MOS transistors have respective sources and drains connected with wires. A gate electrode 18 is disposed at the gate of each of the MOS transistors.

The transistors MN0 and MN1 of the CMOS inverters composing the data storage section S are provided on the wider portions of the NMOS regions 13. Of the pairs of access transistors, the transistors MN3 and MN4 are formed on the NMOS regions 13 and the transistors MN2 and MN5 are formed on the NMOS regions 14, as shown in FIG. 5.

The two pairs of bit lines (BLa, /BLa) and (BLb, /BLb) for the ports A and B are completely the same as in EMBODIMENT 1 and disposed separately on a per bit-line-pair basis on the P-wells 2a and 2b which are arranged laterally on both sides of the N-well 1, as shown in FIG. 2.

According to the present embodiment, effects additional to the effects achieved by EMBODIMENT 1 are achievable.

In the memory cell 20 according to the present embodiment, the wider portion of each of the NMOS regions 13 is provided to expand toward the N-well 1 so that the side of each of the NMOS active regions 14 located adjacent the N-well 1 which is opposed to the N-well 1 has a reduced length. This suppresses or prevents latch-up.

EMBODIMENT 3

The present embodiment will be described with reference to FIG. 1A, FIG. 2, and FIG. 6.

Figure 6:
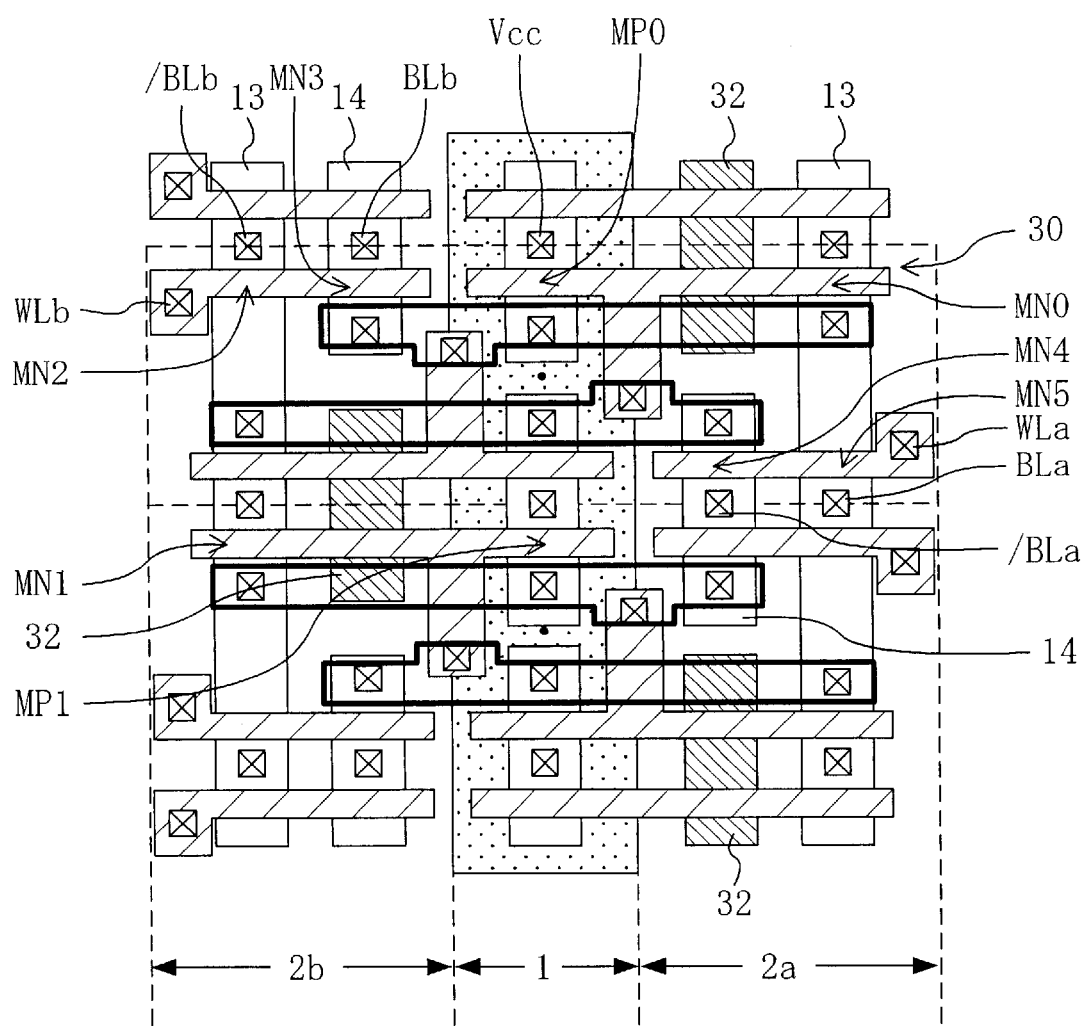
FIG. 6 is a diagrammatical top view of the layout of a memory cell according to EMBODIMENT 3.
Figure 7A:
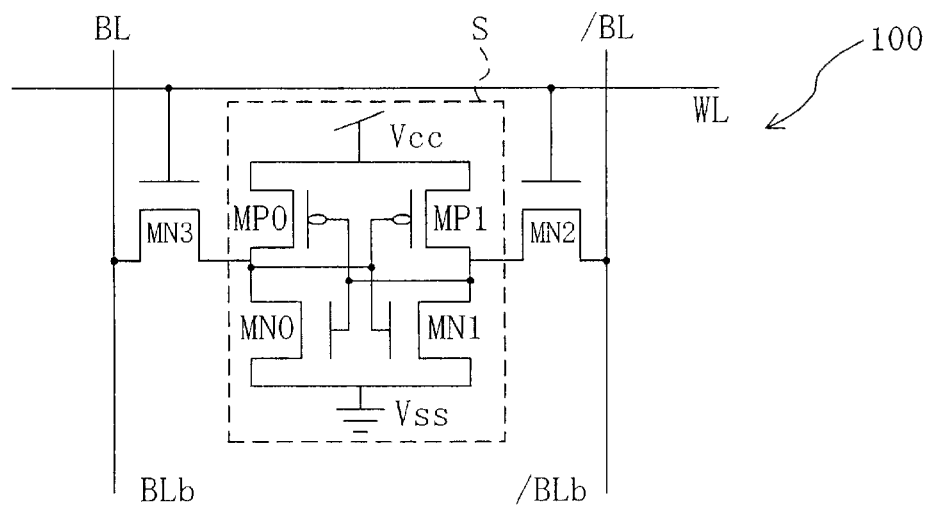
FIG. 7A is a circuit diagram of a memory cell provided in a conventional 1-port 6-transistor SRAM device and FIG. 7B is a diagrammatical top view of the layout of the memory cell.
Figure 7B:
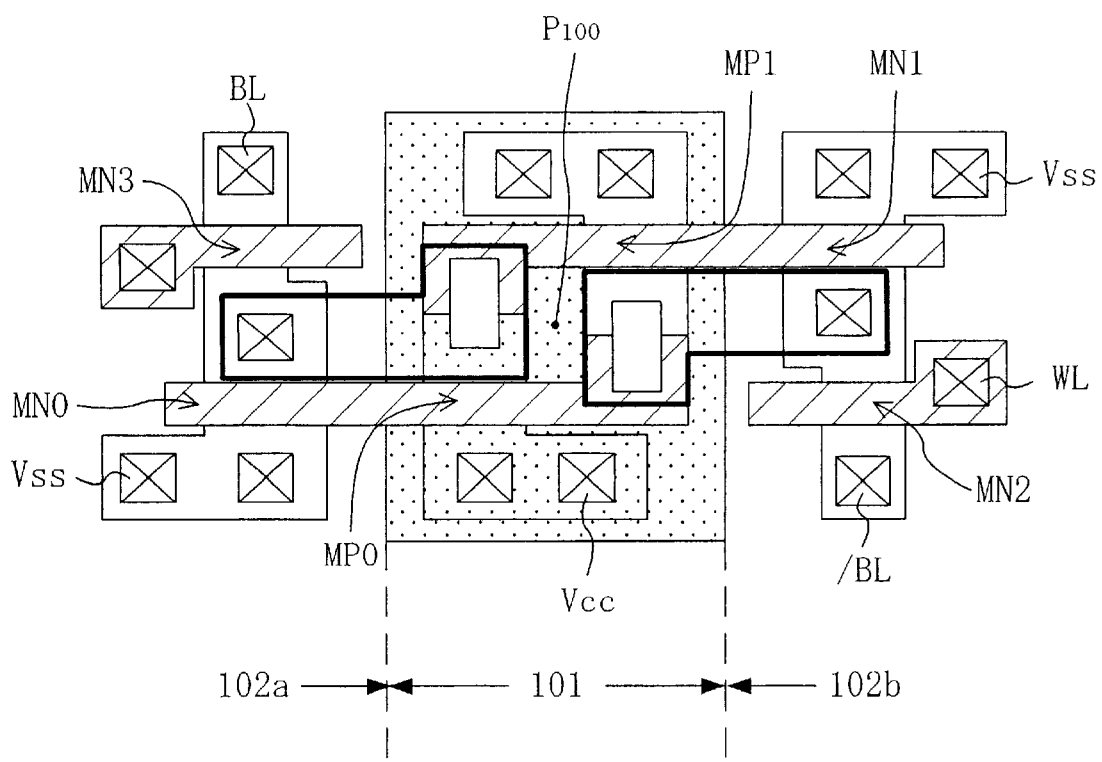
Figure 8A:
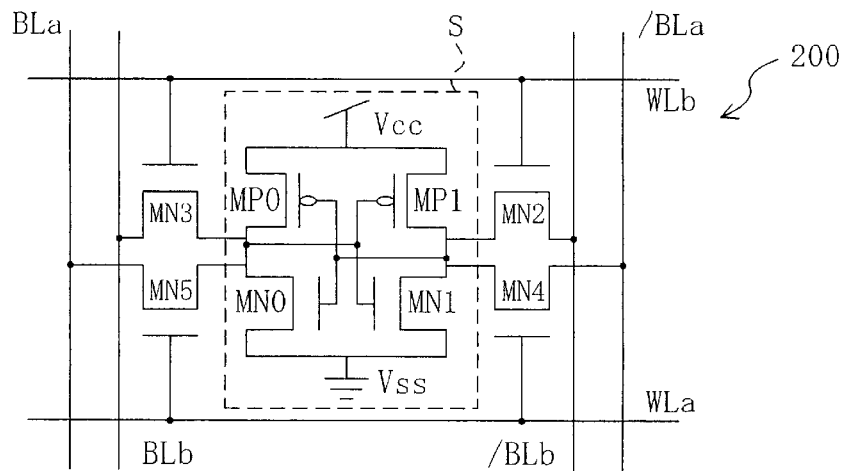
FIG. 8A is a circuit diagram of a memory cell provided in a conventional 2-port 8-transistor SRAM device fabricated by using prior art technology and FIG. 8B is a diagrammatical top view of the layout of the memory cell.
Figure 8B:
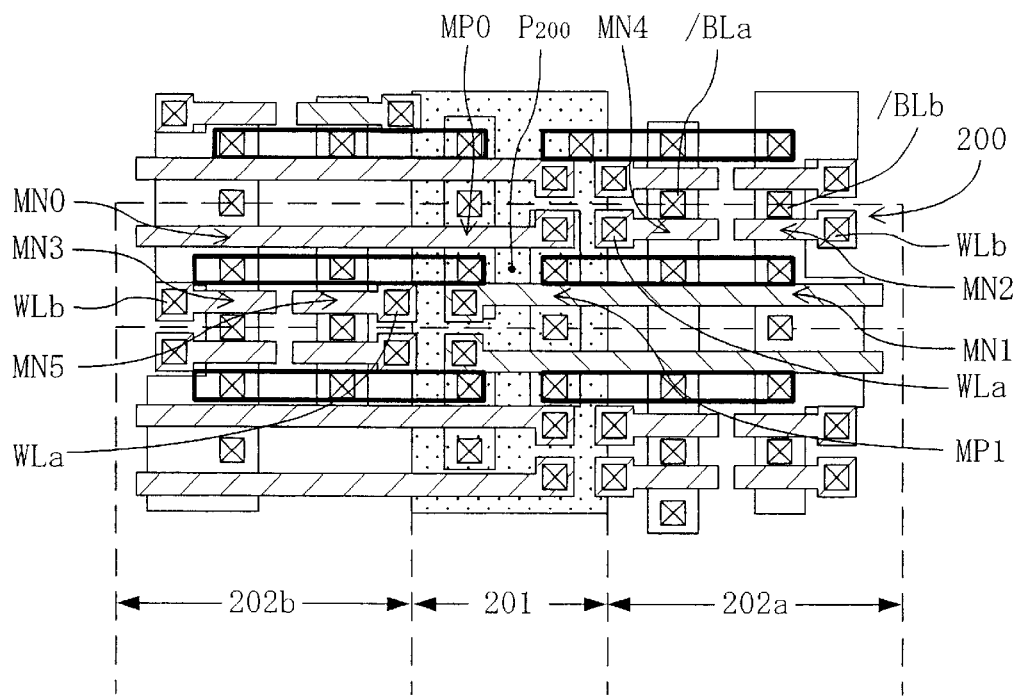
Figure 9:
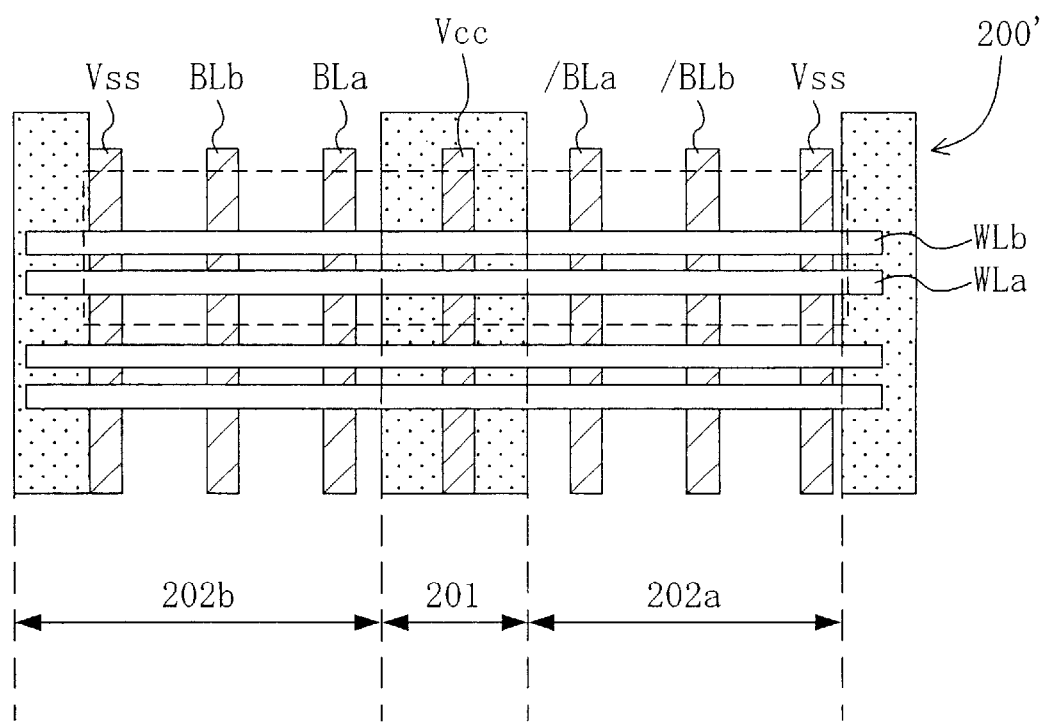
FIG. 9 shows a structure of the bit lines and word lines of the conventional memory cell shown in FIG. 8B.

FIG. 6 is a diagrammatical top view of the layout of a memory cell 30 according to the present embodiment. The memory cell 30 according to the present embodiment has the same circuit structure as the memory cell 10 or 20 according to EMBODIMENT 1 or 2, i.e., the circuit structure shown in FIG. 1A. The placement of the bit lines and the word lines is the same as in the memory cell 10 or 20 according to EMBODIMENT 1 or 2. The bit lines and the word lines have the structure shown in FIG. 2.

Specifically, as shown in FIG. 6, the memory cell 30 according to the present embodiment has a layout approximately the same as the memory cell 20 according to EMBODIMENT 2 except that the memory cell 30 according to the present embodiment has NMOS regions 13 each having a uniform width, in contrast to the NMOS regions 13 of the memory cell 10 or 20 according to EMBODIMENT 1 or 2 formed to have the respective wider expanded portions which are not adjacent to the NMOS regions 14, and that dummy active regions 32 are disposed between the N-well 1 and the NMOS regions 13.

According to the present embodiment, the data storage section S of the memory cell 30 has a larger capacity. This suppresses or prevents the destruction of data (soft error) caused by momentary dissipation of charge from the data storage section S under the radiation of a radio-active ray (such as an alpha ray). In the present embodiment, in particular, the dummy active regions 32 are formed in regions which are located between the NMOS regions 13 and the N-well 1 and not formed with the NMOS regions 14. Therefore, it is unnecessary to enlarge the area of the substrate for the formation of the dummy active regions 32. The resulting SRAM has a memory cell in which a soft error is suppressed or prevented, while retaining a high degree of integration.

What is claimes is:

1. An SRAM device comprising a memory cell, the memory cell including:

a first pair of bit lines connected to a first port;

a second pair of bit lines connected to a second port;

a first inverter; and a second inverter having an input terminal connected to an output terminal of the first inverter and an output terminal connected to an input terminal of the first inverter, the memory cell having a first region in which an impurity of a first conductivity type is diffused and second and third regions each of a second conductivity type, the second and third regions being adjacent to the first region and opposed to each other with the first region interposed therebetween, the first pair of bit lines being disposed on the second region and the second pair of bit lines being disposed on the third region.

2. The SRAM device of claim 1, wherein the first inverter is composed of first and second MIS transistors, the second inverter is composed of third and fourth MIS transistors, the memory cell further comprises:

a fifth MIS transistor provided between the output terminal of the first inverter and one of the first pair of bit lines;

a sixth MIS transistor provided between the output terminal of the first inverter and one of the second pair of bit lines;

a seventh MIS transistor provided between the output terminal of the second inverter and the other of the first pair of bit lines; and an eighth MIS transistor provided between the output terminal of the second inverter and the other of the second pair of bit lines, and the first, second, third, fourth, fifth, sixth, seventh, and eighth MIS transistors have respective channels oriented in approximately the same direction.

3. The SRAM device of claim 1, wherein the second and fourth MIS transistors are formed on the first region, the first, fifth, and seventh MIS transistors are formed on the second region, the third, sixth, and eighth MIS transistors are formed on the third region, the first and third MIS transistors are disposed in generally symmetrical relation relative to a center point of the memory cell;

the fifth and sixth MIS transistor are disposed in generally symmetrical relation relative to the center point of the memory cell, the seventh and eighth MIS transistor are disposed in generally symmetrical relation relative to the center point of the memory cell, and the second and fourth MIS transistor are disposed in generally symmetrical relation relative to the center point of the memory cell.

4. The SRAM device of claim 3, further comprising:

a first gate wire providing connections among a gate of the fifth MIS transistor, a gate of the seventh MIS transistor, and the first port; and a second gate wire providing connections among a gate of the sixth MIS transistor, a gate of the eighth MIS transistor, and the second port wherein the first and second gate wires are disposed in generally symmetrical relation relative to the center point of the memory cell.

5. The SRAM device of claim 1, wherein the second and fourth MIS transistors have respective channels oriented in parallel to a direction in which the first pair of bit lines extend and disposed on a straight line passing through the center point of the memory cell.

6. The SRAM device of claim 1, wherein the first conductivity type is an n-type and the second conductivity type is a p-type.

7. The SRAM device of claim 3, further comprising:
   a first active region provided with the first MIS transistor and either one of the fifth and seventh MIS transistors and indiscrete in the direction in which the bit lines extend; and
   a second active region provided with the third MIS transistor and either one of the sixth and eighth MIS transistors and indiscrete in the direction in which the bit lines extend.

8. The SRAM device of claim 7, wherein
   the first active region has a first expanded portion,
   the second active region has a second expanded portion,
   the first MIS transistor is formed on the first expanded portion, and
   the third MIS transistor is formed on the second expanded portion.

9. The SRAM device of claim 8, wherein the first and second expanded portions are formed on the respective parts of the first and second active regions each opposed to the first region.

10. The SRAM device of claim 8, wherein the first and second expanded portions are formed on the respective parts of the first and second active regions each opposite to the first region.

11. The SRAM device of claim 7, wherein dummy active regions for increasing respective parasitic capacitances of the first and second inverters are disposed between the first region and the first active region and between the first region and the second active region.

12. The SRAM device of claim 1, further comprising:
   a power supply line disposed between the first and second pairs of bit lines in parallel relation to the first and second pairs of bit lines;
   a first ground line disposed in opposing relation to the power supply line with the first pair of bit lines interposed between the first ground line and the power supply line; and
   a second ground line disposed in opposing relation to the power supply line with the second pair of bit lines interposed between the second ground line and the power supply line.

* * * * *